United States Patent  
Bo et al.

(10) Patent No.: US 12,527,024 B2
(45) Date of Patent: Jan. 13, 2026

(54) TRANSISTORS WITH DUAL WELLS (71) Applicant: TEXAS INSTRUMENTS INCORPORATED, Dallas, TX (US)

(72) Inventors: Xiang-Zheng Bo, Plano, TX (US); Michelle N. Nguyen, Allen, TX (US); Douglas T. Grider, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/102,833

(22) Filed: Jan. 30, 2023

(65) Prior Publication Data

US 2023/0178652 A1 Jun. 8, 2023

Related U.S. Application Data

(62) Division of application No. 17/070,097, filed on Oct. 14, 2020, now abandoned, and a division of application No. 15/871,785, filed on Jan. 15, 2018, now Pat. No. 10,811,534.

(60) Provisional application No. 62/611,485, filed on Dec. 28, 2017.

(51) Int. Cl.
*H10D 30/60* (2025.01)
*H01L 21/265* (2006.01)
*H10D 30/01* (2025.01)
*H10D 62/17* (2025.01)

(52) U.S. Cl.
CPC ......... *H10D 30/603* (2025.01); *H01L 21/265* (2013.01); *H10D 30/0212* (2025.01); *H10D 30/022* (2025.01); *H10D 30/0221* (2025.01); *H10D 30/0227* (2025.01); *H10D 62/307* (2025.01)

(58) Field of Classification Search
None
See application file for complete search history.

(56) References Cited

U.S. PATENT DOCUMENTS

| 4,597,824 | A | | 7/1986 | Shinada et al. | |
|---|---|---|---|---|---|
| 4,968,639 | A | * | 11/1990 | Bergonzoni | H10D 30/0227 438/231 |
| 5,583,067 | A | * | 12/1996 | Sanchez | H01L 29/1083 257/E21.205 |

(Continued)

OTHER PUBLICATIONS

PCTSearch Report for Application No. PCT/US 2018/065256, dated Mar. 14, 2019.

*Primary Examiner* — Hung K Vu
(74) *Attorney, Agent, or Firm* — Andrew R. Ralston; Frank D. Cimino (57) ABSTRACT

In some examples, a transistor includes a semiconductor layer having a first conductivity type and a first dopant concentration. A gate dielectric layer is between a gate electrode and the semiconductor layer. A first source/drain region is adjacent a first sidewall of the gate electrode and a second source/drain region is adjacent an opposite second sidewall of the gate electrode, the first and second source/drain regions having an opposite second conductivity type. A well region is located in the semiconductor layer and has the first conductivity type and a greater second dopant concentration. The well region underlies the first sidewall and the semiconductor layer extends to the gate electrode under the second sidewall of the gate electrode.

18 Claims, 10 Drawing Sheets

(56) References Cited

U.S. PATENT DOCUMENTS

| | | |
|---|---|---|
| 5,903,029 A | 5/1999 | Hayashida et al. |
| 6,281,062 B1 * | 8/2001 | Sanchez .............. H01L 29/1083 |
| | | 257/E29.054 |
| 6,359,319 B1 * | 3/2002 | Noda .................... H10B 10/12 |
| | | 257/E27.099 |
| 6,448,104 B1 | 9/2002 | Watanabe |
| 2001/0010954 A1 | 8/2001 | Lin et al. |
| 2004/0157397 A1 * | 8/2004 | Quek .................. H01L 29/6656 |
| | | 438/305 |
| 2006/0170055 A1 | 8/2006 | Mitros et al. |
| 2010/0163983 A1 | 7/2010 | Choi |
| 2012/0003806 A1 | 1/2012 | Wang |
| 2017/0084736 A1 | 3/2017 | Toh et al. |

\* cited by examiner

TRANSISTORS WITH DUAL WELLS

CROSS-REFERENCE TO RELATED APPLICATIONS

The present application claims priority to U.S. Provisional Patent Application No. 62/611,485, which was filed Dec. 28, 2017, is titled "Transistors With Dual Wells," and is hereby incorporated herein by reference in its entirety. This application is a divisional of U.S. patent application Ser. No. 15/871,785, issued as U.S. Pat. No. 10,811,534, which is incorporated herein by reference in its entirety

BACKGROUND

A transistor is the fundamental building block of modern day electronic devices and is ubiquitously used in modern electronic systems, such as smartphones, personal computers, etc. One of the most common applications of a transistor is a switch. A transistor that utilizes an electric field to control its switching ability is known as a field effect transistor (FET).

SUMMARY

According to an example, a transistor comprises a substrate having a first conductivity type and a first dopant concentration, a gate dielectric layer over a portion of the substrate and having first and second opposite sidewalls, and a gate electrode over the gate dielectric layer. A channel region is located directly under the gate electrode, a first dielectric sidewall spacer is located on the first sidewall and a second dielectric sidewall spacer is located on the second sidewall. A well having the first conductivity type and a different second dopant concentration underlaps the gate electrode. A first source/drain region having a second opposite conductivity type is within the well and extends under the first dielectric sidewall spacer and toward the channel region. A second source/drain region having the second opposite conductivity type extends under the second dielectric sidewall spacer. The channel region touches the well at a first end and contacts the substrate portion at an opposite second end.

According to another example, in integrated circuit includes a first doped region having a first conductivity type in a semiconductor substrate region having the first conductivity type. The first doped region has a higher dopant concentration than the semiconductor substrate region and interfaces the semiconductor substrate region under a conductive structure having a first sidewall and a second opposing sidewall. A second doped region and a first extension both having a second opposite conductivity type are located within the first doped region. A third doped region and a second extension both having the second conductivity type are located between the second and third doped regions and have a lower dopant concentration than the second and third doped regions. The second doped region and the first extension are spaced apart from the substrate region by the first doped region, and the second extension touches the substrate region. A dielectric layer is located between the first and second extensions and between the conductive structure and the substrate region. The first doped region extends from the second doped region and under the first sidewall toward the third doped region, and the second extension touches the substrate region.

According to yet another example, a transistor includes a semiconductor layer having a first conductivity type and a first dopant concentration. A gate dielectric layer is between a gate electrode and the semiconductor layer. A first source/drain region is adjacent a first sidewall of the gate electrode and a second source/drain region is adjacent an opposite second sidewall of the gate electrode, the first and second source/drain regions having an opposite second conductivity type. A well region is located in the semiconductor layer and has the first conductivity type and a greater second dopant concentration. The well region underlies the first sidewall and the semiconductor layer extends to the gate electrode under the second sidewall of the gate electrode.

BRIEF DESCRIPTION OF THE DRAWINGS

For a detailed description of various examples, reference will now be made to the accompanying drawings in which.

DETAILED DESCRIPTION

A FET typically includes a source region ("source"), a drain region ("drain"), and a gate layer ("gate"). The source and drain are fabricated in a substrate, and the gate is positioned on the substrate. A FET controls the flow of carriers (electrons or holes) from the source to the drain by affecting the size and/or the shape of a conductive channel ("channel") generated by voltage (or lack of voltage) applied at the gate. The channel is formed when the voltage across the gate (or gate-to-source) is higher than a threshold voltage. A FET is said to be "closed" or short-circuited when the aforementioned channel exists, i.e., when the gate voltage is higher than a threshold voltage and the channel provides a low resistive path for the carriers to travel between the source and the drain. A FET is said to be "open" or open-circuited when there is no channel between the source and the drain, i.e., the voltage applied across the gate and the source is below a threshold voltage.

A FET can be characterized either as a p-type FET or an n-type FET, depending on the type of dopant (p-type or n-type) used to dope various portions (e.g., source, drain, and substrate) and the type of majority carriers that form the channel in the FET. For instance, an n-type FET forms a channel with electrons as the majority carrier, and a p-type FET forms a channel with holes being the majority carrier. A p-type FET typically includes a source and a drain that is doped with a p-type dopant (e.g., group III elements of the periodic table). The p-type FET further includes a substrate that is doped with an n-type dopant (e.g., group V elements of the periodic table.) However, an n-type FET includes a source and a drain that is doped with an n-type dopant, and a substrate that is doped with a p-type dopant.

For the sake of illustration, in the following description, the case of an n-type FET is assumed. As a positive voltage is applied to the gate layer of an n-type FET, a vertical electric field is produced. This vertical electric field attracts electrons from the body of the p-type substrate to the gate layer and repels the holes present near the gate layer to the body of the substrate. At a threshold voltage, the attracted electrons may move towards the top surface of the substrate and become the dominant carrier in a narrow layer at the surface, effectively making the narrow layer n-type, i.e., dominant with electrons. This results in the formation of a channel of electrons between the source and the drain. The type of FET (n-type or p-type) dictates the carrier (electron or hole) that may form the channel. For example, as described above, an n-type FET may form a channel including electrons as carriers. Using a similar principle, a p-type FET may form a channel including holes as carriers.

In some cases, the length of the gate layer may be used as a parameter to define the size of a transistor. In other cases, the size of the transistor may be defined using other different parameters (e.g., half pitch of the first metal). The size of a transistor is an important parameter as it may dictate the switching speed of an integrated circuit. Therefore, semiconductor companies have been researching to scale down the size of a transistor. A smaller transistor may assist in increasing the overall performance of an integrated circuit (by increasing the number of transistors that can be fabricated in the same amount of area.) However, a small transistor size may bring about additional challenges, such as sub-threshold leakage. For example, as described above, a channel may form at the surface of a substrate when a threshold voltage is applied to the gate layer. However, as a transistor is scaled down in size, transistor threshold voltage decreases as the due to merging of the source and drain depletion regions. A leakage current may flow between the source and the drain at the sub-threshold voltage.

Various techniques have been employed to reduce the sub-threshold leakage. One of the techniques includes increasing the channel doping concentration. However, increasing the channel doping concentration lowers the mobility of the carriers in the channel, and reduces the performance of a transistor. Other techniques include using pocket implants at both the source and the drain to increase the threshold voltage of the transistor. However, pocket implants increase transistor mismatch and may further degrade source/drain junction breakdown.

Accordingly, this disclosure uses dual well to improve transistor performance. A relatively lower concentration dopant is implanted into the substrate, making the substrate a first well. A second well with relatively higher concentration dopant is implanted in the source and/or the drain. In some examples, the first well forming at least a portion of the channel improves the carrier mobility, and the second well in the source and/or drain regions may increase transistor threshold voltage and may further reduce the transistor subthreshold voltage. Accordingly, at least some of the examples in this disclosure are directed to a transistor that has an improved (i.e., lower) sub-threshold leakage, drive current and transconductance. In particular, the examples disclosed herein are directed towards using dual wells, with the substrate being the first well. The second well may be implanted in the substrate such that the source region overlaps one segment of the second well and the drain region overlaps the other segment of the second well. Extensive correlation tests revealed that transistors containing dual wells have a higher threshold voltage relative to a transistor without the dual wells. The higher the threshold voltage, the lower the sub-threshold leakage.

Figure 1:
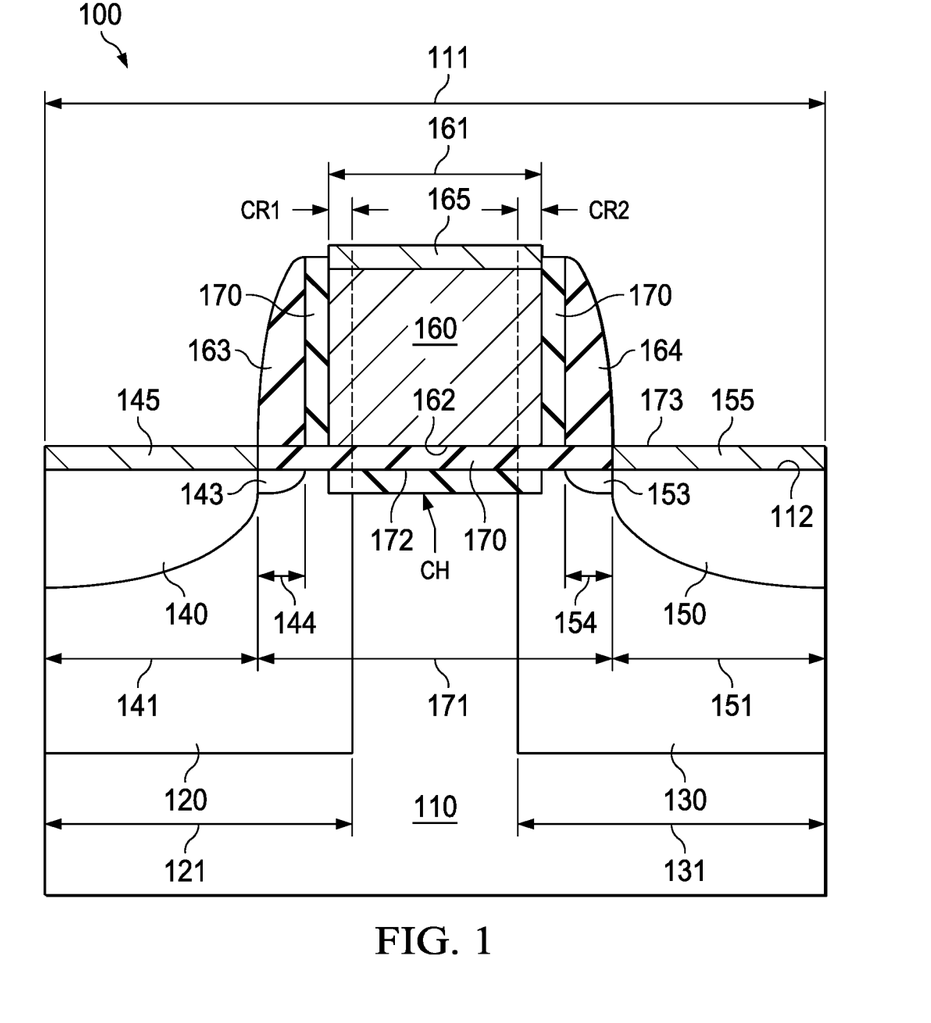
FIG. 1 is a cross section of an illustrative transistor that includes dual wells, in accordance with various examples.

FIG. 1 is a cross section of an illustrative transistor 100 that includes dual wells. The transistor 100 includes a substrate 110 that may include silicon, which may be doped with an n-type dopant or a p-type dopant. The doped substrate 110 may form the first well. In some examples, the first well may be formed by implanting dopants. For illustration's sake, it is assumed that the transistor 100 is an n-type transistor, i.e., the substrate 110 is doped with p-type dopants (e.g., elements from group III of the periodic table of elements, such as boron) and a source region 140 and a drain region 150 are doped with n-type dopants (e.g., elements from group V of the periodic table of elements, such as phosphorus). The scope of this disclosure is not limited to n-type transistors. Similar principles, as described below, may be applied to p-type transistors. In the case of p-type transistors, the first well may, for example, be an n-type well formed in a p-type substrate or an n-type substrate.

The illustrative transistor 100 includes a second well that may include first segment 120 and a second segment 130. In this disclosure, the combination of the first well (i.e., the substrate 110) and the second well (i.e., the first segment 120 and the second segment 130) may sometimes be referred to as dual wells. The transistor 100 further includes the source region 140, a source contact layer 145, the drain region 150, a drain contact layer 155, the source extension layer 143, the drain extension layer 153, a gate layer 160, a gate contact layer 165, and a gate oxide layer 170. The transistor 100 also includes spacer regions 163, 164. The substrate 110 includes a top side 112. The transistor 100 also includes the gate oxide layer 170 having a bottom side 172 and a top side 173, such that the bottom side 172 interfaces with the top side 112.

The transistor 100 further depicts the gate layer 160 having a bottom side 162 interfacing with the top side 172 along a portion 161, which may be referred to as the physical gate length. Stated another way, the bottom side 162 of the gate layer 160 shares the portion 161 with the top side 112. The substrate 110 further includes the first segment 120 and the second segment 130, both of which may be doped with the same type of dopant that is used to dope the substrate 110. However, the doping concentration of the first and the second segment 120, 130 may be high relative to the doping concentration of the substrate 110. For example, the substrate 110 may be doped with p-type dopants and may have a concentration of $5 \times 10^{15} \sim 1 \times 10^{17}$ cm−3. The first and the second segment 120, 130 may be formed by implanting additional p-type dopants in the substrate, such that the doping concentrations of the first and the second segment may be $5 \times 10^{17} \sim 5 \times 10^{18}$ cm−3. In some examples, the concentration of first and the second segment may be substantially (i.e., lie within a 10% range relative to each other) equal. The first segment 120 may overlap a portion with the gate 160. This coinciding region is referred to as "CR1". The second segment 130 may further overlap a portion 131 with the top side 112. The portion 131 may coincide with the portion 161 and this coinciding region is referred to as "CR2". Stated another way, CR1 and CR2 are regions of the first segment 120 and the second segment 130 (respectively) that are present below the gate layer 160.

In some examples, the source region 140 and the drain region 150 are doped with a type of dopant that is complementary to the dopant type used to dope the substrate 110, i.e., for an n-type transistor, the substrate 110 is doped with a p-type dopant. Complementary to the p-type dopants, the source and the drain regions 140, 150 are doped with an n-type dopant. In some examples, the source and the drain regions 140, 150 are highly doped and may have a concentration of $1 \times 10^{20} \sim 1 \times 10^{21}$ cm$^{-3}$. In some examples, the concentration of the source and the drain regions 140, 150 may be substantially (i.e., lie within a 10% range relative to each other) equal. As depicted in FIG. 1, the source region 140 is implanted such that the source region 140 is positioned inside the first segment 120. The source region 140 may also overlap along a portion 141 with the top side 112. Similar to the source region 140, the drain region 150 may also be implanted such that the drain region 150 is positioned in the second segment 130. The drain region 150 may also overlap along a portion 151 with the top side 112. The source and drain extension layers 143, 153 are lightly doped with the same type of dopant that is used to dope the source and the drain regions 140, 150, i.e., an n-type dopant. The doping concentration of the extension layers 143, 153 may be lower than the doping concentration of the source and the drain regions 140, 150 and can be in the range of $5 \times 10^{18} \sim 5 \times 10^{19}$ cm$^{-3}$. The first and second extension layers 143, 153 may also overlap with the top side 112 and may also extend a portion 144 and a portion 154 to the channel (CH) from the source 140 and the drain 150 (respectively). In some examples, the channel CH extends from the source 140 to the drain 150, respectively.

In some examples, the transistor 100 may be "symmetric", i.e., the first and second segments 120, 130 may be of equal or substantially equal (i.e., one within 10% of another) dimensions. In such a case, the coinciding regions CR1 and CR2 may be of equal or substantially equal lengths (i.e., one within 5%-10% of another) and symmetric around the gate 160.

Figure 2A:
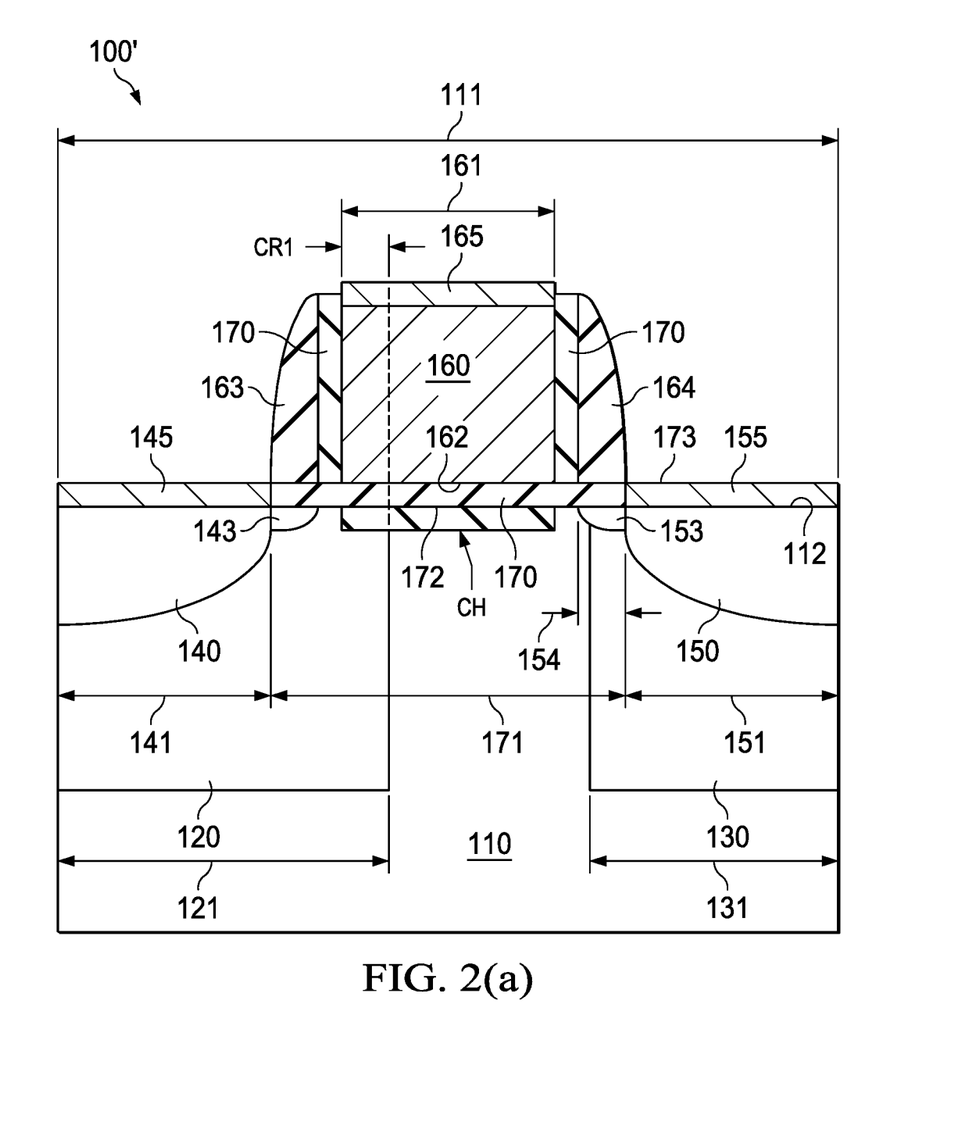
FIG. 2(a)-2(b) depicts cross section of another illustrative transistor that includes dual wells, in accordance with various examples.
Figure 2B:
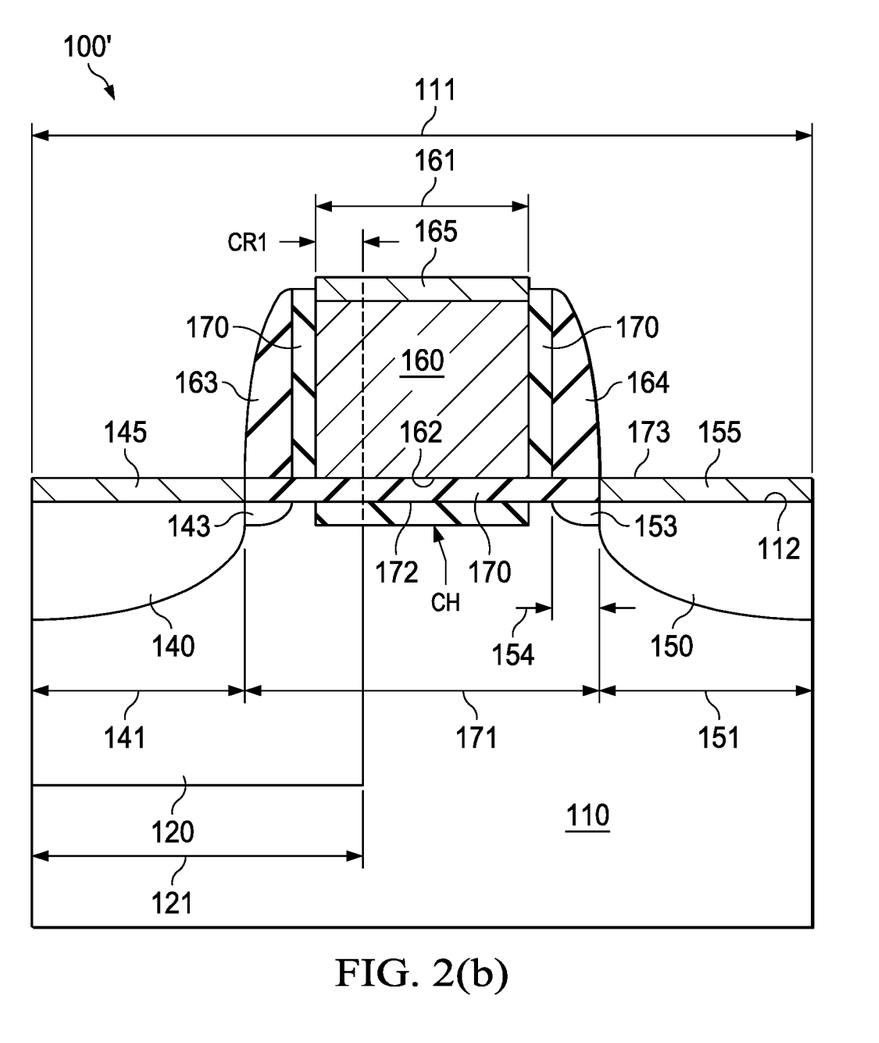

FIG. 2(a) depicts an illustrative transistor 100' that includes the first and second segments 120, 130 of unequal dimensions. Such transistors may also be referred to as "asymmetric." In such example transistors, the coinciding regions CR1 and CR2 may be of unequal lengths. In other examples, unequal lengths of CR1, CR2 may include a portion 131 that may be smaller than the portion 121 such that the portion 131 may not be coincident with the portion 161 (as depicted in FIG. 2(a)). Stated another way, unequal length may include a transistor 100' in which there is no coinciding region CR2. In some examples, as depicted in FIG. 2(b), the second segment 130 may not be present and in such a case, there is no coinciding region CR2. In such examples, the substrate 110 forming the first well improves the carrier mobility, and the second well formed by the first segment 120 may increase transistor threshold voltage and that may reduce the transistor subthreshold voltage. The description of the transistor 100 (of FIG. 1) may be valid for the transistors 100' of FIGS. 2(a) and 2(b).

As noted above, as a transistor is scaled down in size, a sub-threshold leakage current may flow between the source and the drain at the sub-threshold voltage. In this disclosure, the sub-threshold leakage may improve due to the higher doping concentration in the first segment 120. In some examples, implanting the first segment 120 such that it overlaps the source region 140 and is coincident with at least a portion (CR1) of the gate layer 160 may improve the sub-threshold leakage by increasing the threshold voltage. Referring now to FIG. 1, in operation, when a gate voltage equal to or greater than a threshold voltage is applied to the gate layer 160, a channel CH is formed in the substrate 110. As depicted in FIG. 1, most of the channel CH is formed in the substrate 110 (i.e., in the first well with lower doping concentration relative to the second wells.) However, as the size of a transistor decreases, the relative distance between the source region 140, drain region 150, and the gate region 160 also decreases. In such a case, the asymmetric transistor 100' (depicted in FIG. 2(a) and FIG. 2(b)) may be used. The transistor 100' includes the first segment 120 such that it completely overlaps the source region 140 and shares some portion CR1 with the gate 160. The second segment 130 in transistor 100' may overlap the drain region 150, but the second segment 130 may not coincide with the gate layer 160 under it, i.e., the CR2 region may not exist in the transistor 100'.

Figure 3:
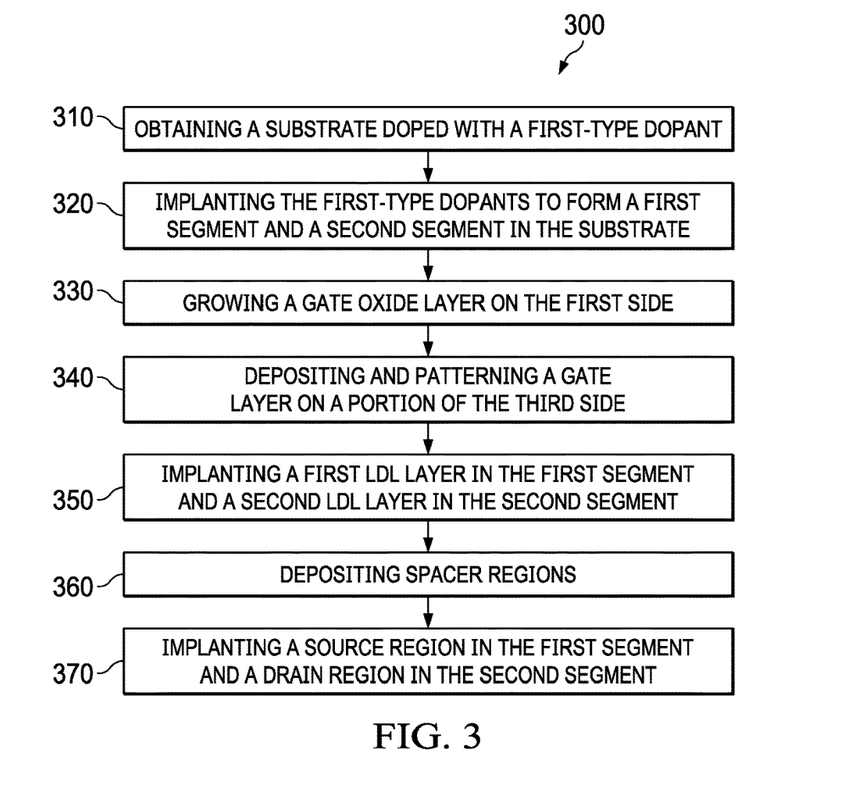
FIG. 3 is an illustrative method to fabricate an illustrative transistor that includes dual wells, in accordance with various examples.
Figure 4A:
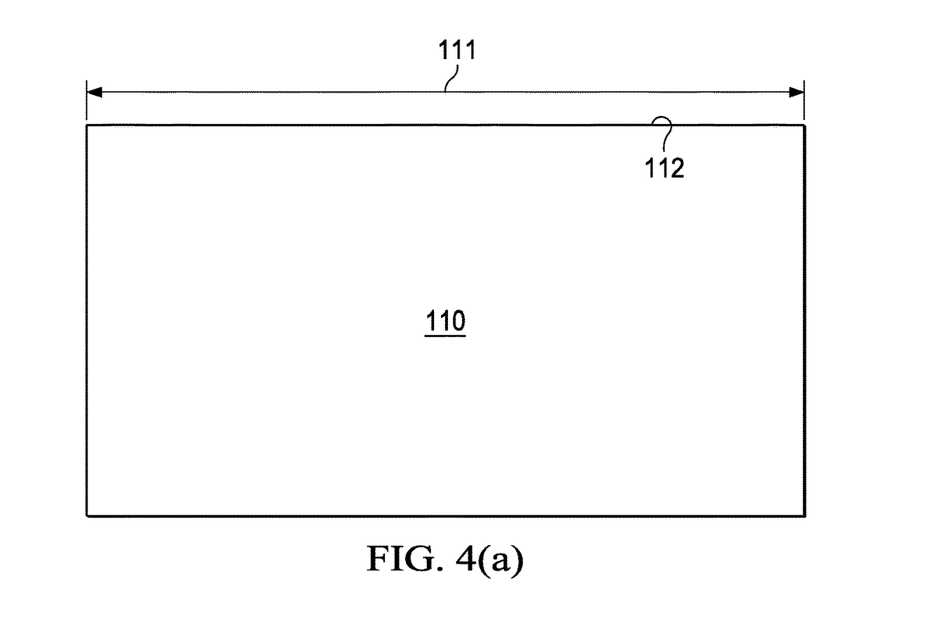
FIG. 4(a)-FIG. 4(h) depict an illustrative step-by-step fabrication process to fabricate an illustrative transistor that includes dual wells, in accordance with various examples.

FIG. 3 depicts an illustrative method 300 to fabricate a transistor 100 (FIG. 1). For illustration's sake, it is assumed that the transistor 100 is an n-type transistor. The method 300 is described in tandem with FIG. 4(a)-FIG. 4(h), which illustrates the step-by-step fabrication process that may be used to fabricate the transistor 100. Step 310 includes obtaining a substrate 110 that is doped with a first-type dopant. For clarity sake, FIG. 4(a) also depicts the top side 112 and the length 111 of the substrate 110. The substrate 110 (or the first well) may be implanted using ion implantation with a p-type dopant. The doping concentration of the substrate 110, as noted above, can be $5 \times 10^{15} \sim 1 \times 10^{17}$ cm$^{-3}$. The method 300 further includes implanting the first-type dopants to form the first segment 120 and the second segment 130 (step 320, FIG. 4(b)). As noted above, the first and second segments 120, 130 are implanted with the same dopant type as the type of dopant used to dope the substrate 110. Therefore, the step 320 includes doping the substrate with additional p-type dopants, i.e., the first and second segments 120, 130 are areas in the substrate 110 that are highly doped relative to the rest of the substrate 110. The first and second segments 120, 130 depicted in FIG. 4(b) may be symmetrical (as described above in FIG. 1). However, the step 320 may be adapted to include the first and second segments 120, 130 having unequal dimensions (as depicted in FIG. 2(a).) Similarly, the step 320 may also be adapted to include just the first segment 120 (as depicted in FIG. 2(b).)

Figure 4B:
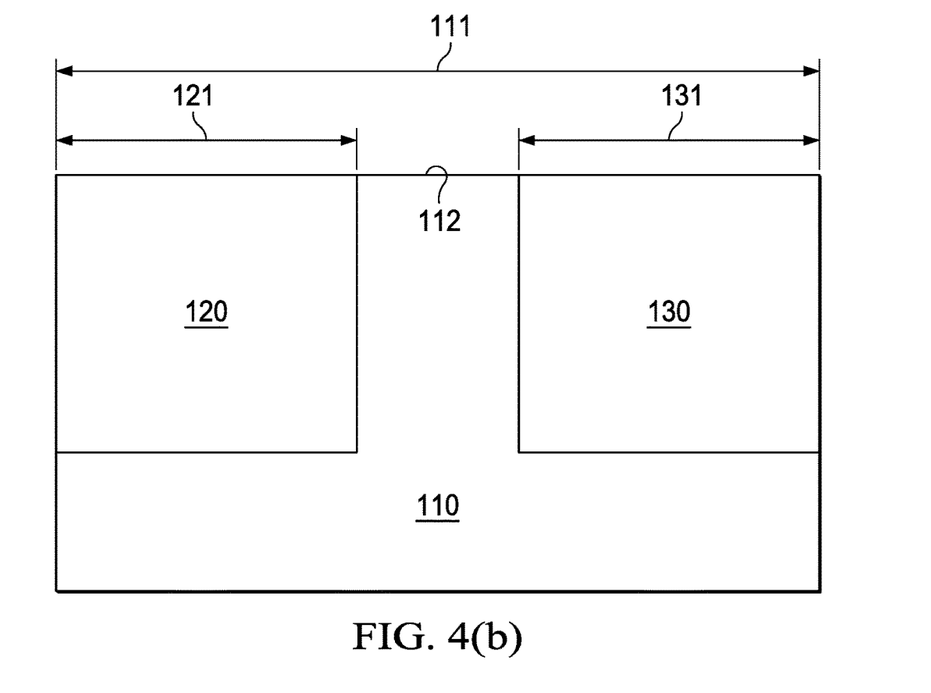

Completing the step 320 may include additional steps that are not expressly recited in the method 300. The additional steps may include first covering the substrate 110 with a photoresist and then using masks/lithography techniques to pattern the photoresist. Following the patterning step, additional p-type dopants may be implanted using an ion implantation technique, which forms the first segment 120 and the second segment 130. The depth of the first and the second segments 120, 130 may depend on the implantation energy, i.e., the more the implantation energy, the deeper the wells. FIG. 4(b) also depicts the portion 121 and the portion 131 that overlap with the top side 112.

Figure 4C:
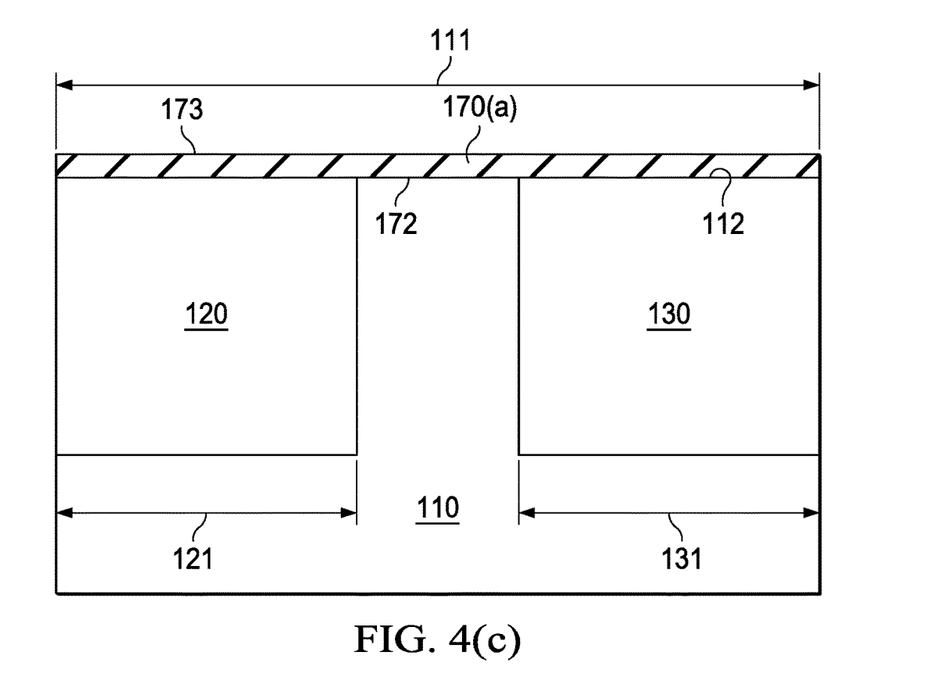
Figure 4D:
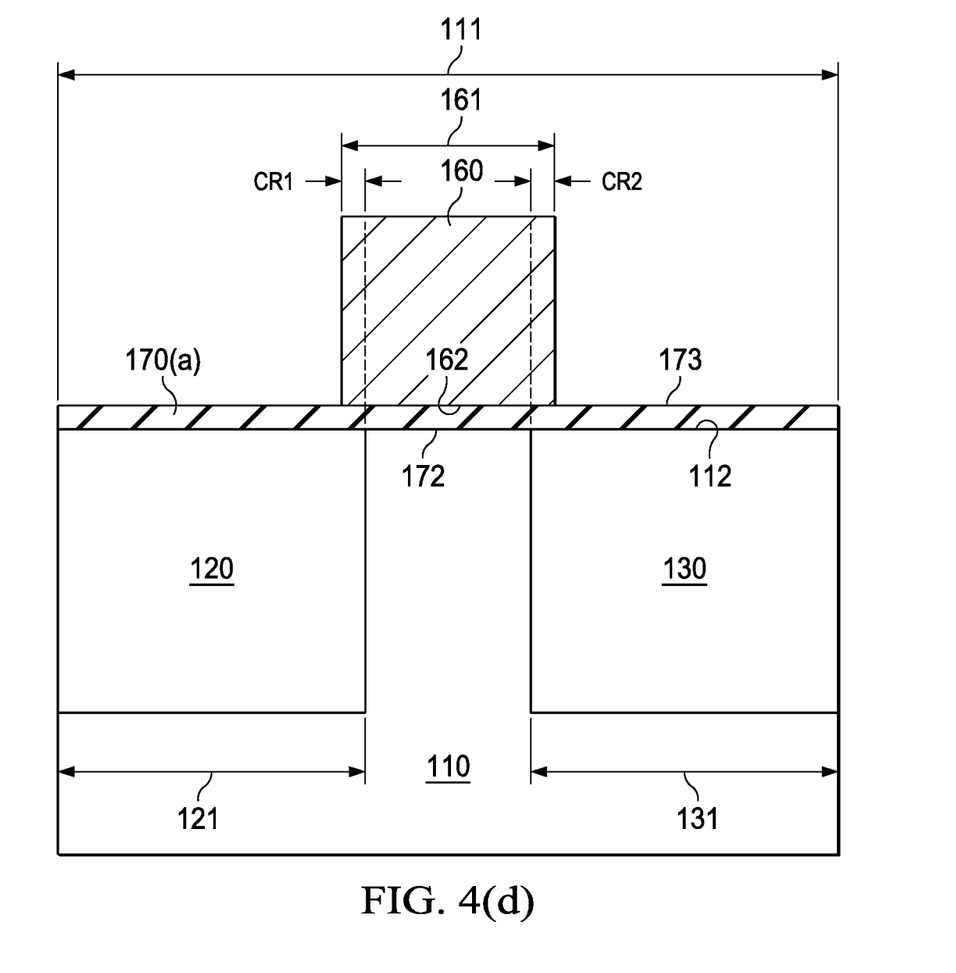

The method 300 continues with growing a gate oxide layer 170 (a) on the top side 112 of the substrate 110 (step 330, FIG. 4(c)). In some examples, the gate oxide layer 170 (a) may be growing by oxidizing the substrate 110 such that the top side 112 is oxidized and forms the gate oxide layer 170 (a). FIG. 4(c) also depicts the bottom side 172 and the top side 173 of the gate oxide layer 170 (a). In other examples, other methods of oxidation, such as in situ steam generation (ISSG) may be used. The method further continues with depositing a gate layer 160 on a portion 161 of the top side 173 (step 340, FIG. 4(d)). The deposition process may include chemical vapor deposition that deposits materials such as polysilicon to form the gate layer 160. The gate layer is then patterned into the portion 161 by photo lithography and plasma dry etch (step 340, FIG. 4(d)). FIG. 4(d) also depicts the coinciding region CR1 between 120 and gate 160, and the coinciding region CR2 between second segment 130 and gate 160, CR2.

Figure 4E:
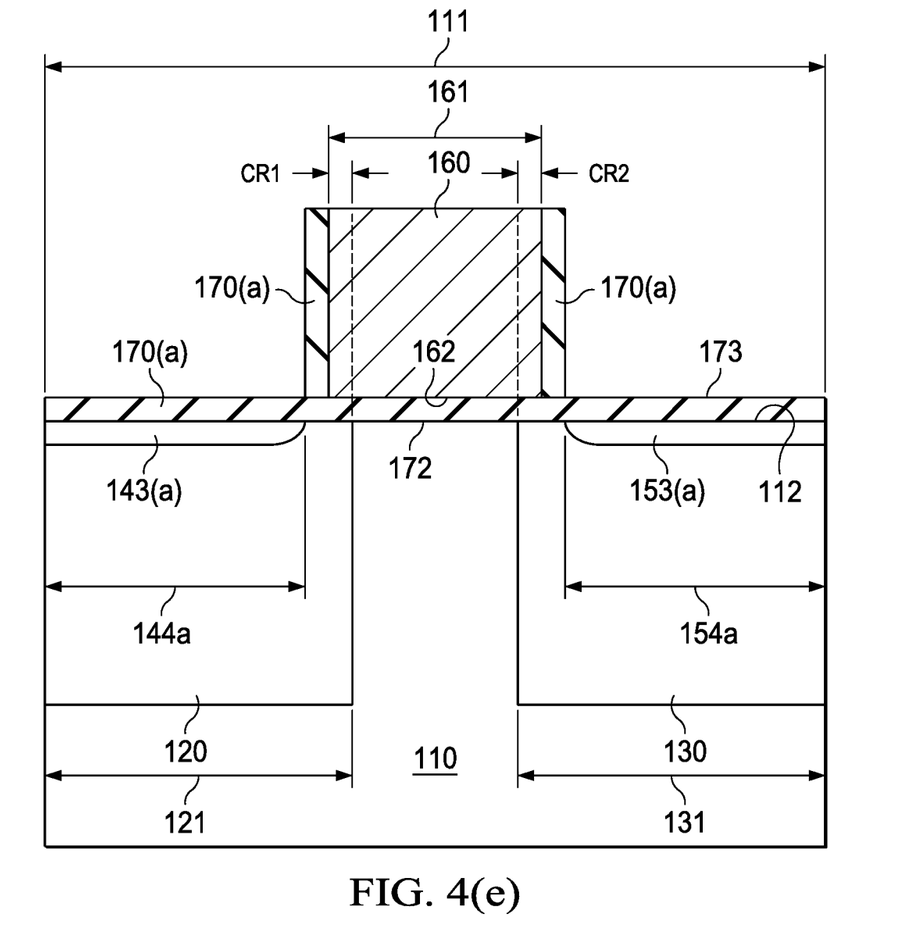
Figure 4F:
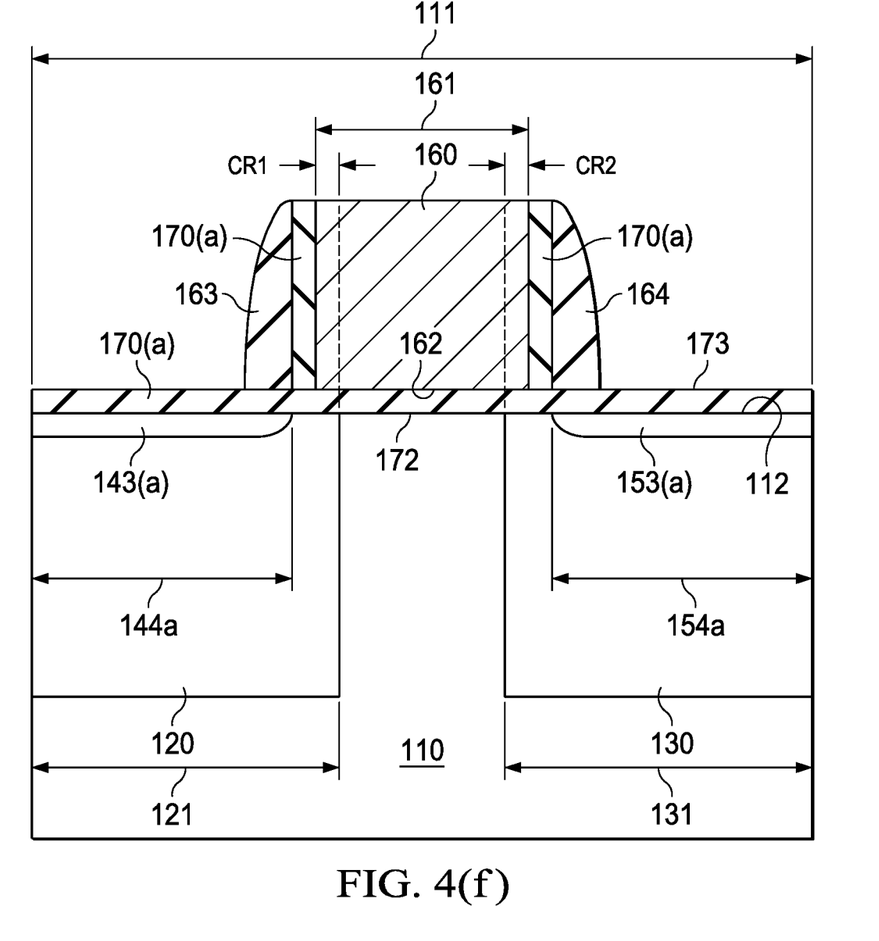

The method 300 continues in step 350 (FIG. 4(e)) with implanting a first lightly doped layer (LDL) 143(a) in the first segment 120 and a second lightly doped layer (LDL) 153(a) in the second segment 130. The first and the second LDLs 143(a) and 153(a) are formed by implanting the type of dopant that is complementary to the type of dopant used to dope the substrate 110, i.e., the LDL 143(a) and 153(a) are doped using n-type dopants, where each LDL has a concentration of $5 \times 10^{18} \sim 1 \times 10^{20}$ cm$^{-3}$. In some examples, the concentration of both the LDLs 143(a), 153(a) may be substantially (i.e., lie within a 2-10% range relative to each other) equal. Different techniques may be used to implant the LDLs, such as ion implantation. As noted above, the implantation energy dictates the depth of the feature. Therefore, while implanting the LDLs, the implantation energy may be such that the LDLs form closer to the top side 112. FIG. 4(e) also depicts the portion 144(a) and the portion 154(a) that overlaps with the top side 112. In some examples, the step 350 may include oxidizing the gate layer 160 such that a gate oxide layer similar to the gate oxide layer 170(a) grows on the sides of the gate layer 160. The method 300 may continue in step 360 (FIG. 4(f)) with depositing spacer regions 163, 164, which may be done by chemical vapor deposition and plasma spacer etch. Spacer region 163 may sometimes be referred to as source spacer region and spacer region 164 may sometimes be referred to as drain spacer region.

Figure 4G:
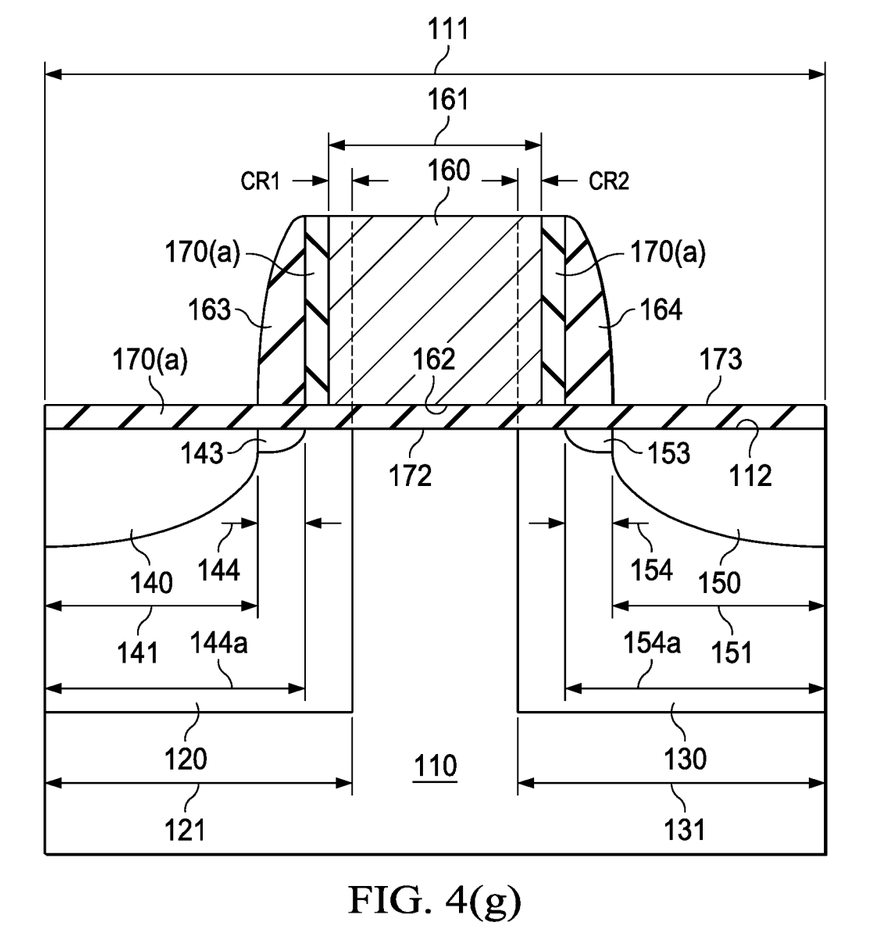
Figure 4H:
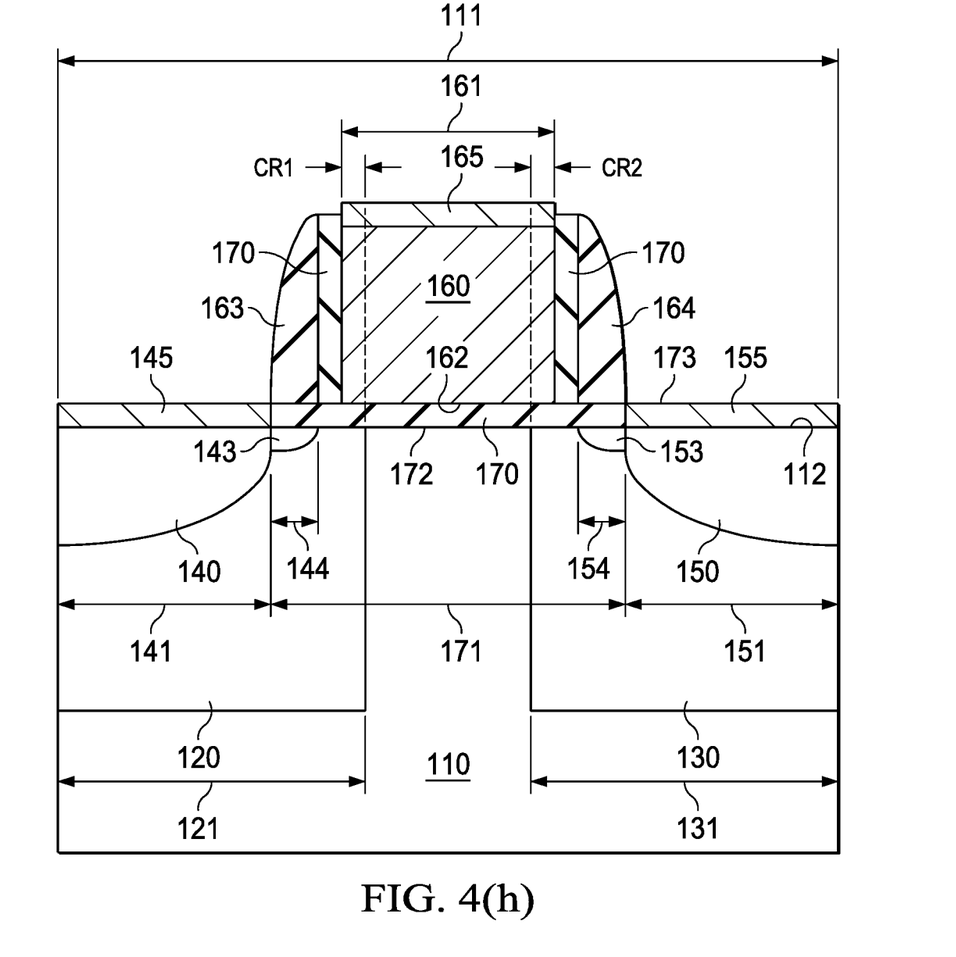

The method 300 then proceeds with implanting the source region 140 and the drain region 150 in the first and second segments 120, 130, respectively (step 370, FIG. 4(g)). As noted above, the example described in this disclosure is of an n-type transistor. Therefore, the source region 140 and the drain region 150 are implanted with the type of dopant that is complementary to the type of dopant used to dope the substrate 110, i.e., an n-type dopant. The doping concentration of both the source and the drain regions 140, 150 may be $1 \times 10^{20} \sim 1 \times 10^{21}$ cm$^{-3}$, which is relatively higher than the doping concentration of the LDLs 143(a) and 143(b). FIG. 4(g) depicts a first extension layer 143 and a second extension layer 153, which are parts of the first and the second LDLs 143(a) and 153(a) (FIG. 4(e)), respectively. Stated another way, because the doping concentrations of the source and drain regions 140, 150 are substantially higher than the doping concentrations of the LDLs 143(a) and 153(a), when the source and the drain regions 140, 150 are implanted, portions of the LDLs 143(a) and 153(a) are completely covered by the highly concentrated source and drain regions 140, 150. Portions of the LDLs 143(a) and 153(a) are not completely overlapped by the source and the drain regions 140, 150 and they are referred to as "extension regions" 143 and 153. The method 300 may also include some additional steps that are not expressly shown in FIG. 3. The method 300 may include etching the oxide layer 170(a) so as to deposit on top of the source, the drain and the gate to form silicide contact layers 145, 155, and 165 (FIG. 4(h)). Different silicide, such as nickel-platinum silicide, titanium silicide, cobalt silicide, may be used as the source, drain, and the gate contact layers 145, 155, 165. The foregoing description is for an n-type transistor 100. However, the scope of this disclosure is not limited to n-type transistors. Similar principles may be applied for different types of transistors, such as p-type transistors.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A transistor comprising:
   a gate dielectric layer over a semiconductor substrate and having first and second opposing sidewalls;
   a gate electrode over the gate dielectric layer;
   a channel region under the gate electrode;
   a first dielectric sidewall spacer on the first sidewall and a second dielectric sidewall spacer on the second sidewall;
   a first well in the semiconductor substrate and under the gate electrode, the first well having a first conductivity type and a first dopant concentration;
   a first source/drain region extending under the first dielectric sidewall spacer and toward the channel region, the first source/drain region having a second conductivity type opposite the first conductivity type;
   a second source/drain region extending under the second dielectric sidewall spacer toward the channel region, the second source/drain region having the second conductivity type; and
   a second well having the first conductivity type and a second dopant concentration and containing the second source/drain region, the second well underlapping the gate electrode and the channel region, the first well laterally spaced apart from the first sidewall by a first distance, and the second well laterally spaced apart from the second sidewall by a different second distance.

2. The transistor of claim 1, wherein the first conductivity type is p-type and the second conductivity type is n-type.

3. The transistor of claim 1, wherein the semiconductor substrate, the first well, and the second well are doped with a first-type dopant comprising an element from group III of the periodic table and the first source/drain region and the second source/drain region are doped with a second-type dopant comprising an element from group V of the periodic table.

4. The transistor of claim 1, wherein the second dopant concentration is higher than the first dopant concentration.

5. The transistor of claim 1 further comprising a corresponding silicide layer formed on each of the first source/drain region, the second source/drain region, and the gate electrode.

6. The transistor of claim 1, wherein the second well comprises a first segment and a second segment respectively disposed on opposing sides of the first well.

7. The transistor of claim 6, wherein the first segment contains at least a portion of the first source/drain region and the second segment contains at least a portion of the second source/drain region.

8. The transistor of claim 7, wherein the first segment underlaps the gate electrode and the channel region by a coinciding region.

9. The transistor of claim 8, wherein the second segment underlaps the gate electrode and the channel region by another coinciding region.

10. An integrated circuit, comprising:
    a first doped region having a first conductivity type in a semiconductor substrate region, the first doped region having a first dopant concentration and interfacing the semiconductor substrate region under a conductive structure having a first sidewall and a second opposing sidewall;
    a second doped region and a first extension both having a second opposite conductivity type within the first doped region, and a third doped region and a second extension both having the second conductivity type, the first and second extensions being located between and having a lower dopant concentration than the second and third doped regions, the second doped region and the first extension being spaced apart laterally from the semiconductor substrate region by the first doped region;

a fourth doped region having the first conductivity type and a second dopant concentration and containing the third doped region and forming a PN junction that intersects the second extension; and a dielectric layer between the first and second extensions and between the conductive structure and the semiconductor substrate region.

11. The integrated circuit of claim 10, wherein the second doped region is configured to operate as a source of a MOSFET, the third doped region is configured to operate as a drain of the MOSFET, and the conductive structure is configured to operate as a gate electrode of the MOSFET.

12. The integrated circuit of claim 10, wherein the first conductivity type is p-type and the second conductivity type is n-type.

13. The integrated circuit of claim 10, further comprising first and second dielectric structures on opposing sidewalls of the conductive structure, the first dielectric structure located over the first extension, and the second dielectric structure located over the second extension.

14. The integrated circuit of claim 10, wherein the second and third doped regions have a higher dopant concentration than the first doped region.

15. The integrated circuit of claim 10, wherein the third doped region is located within the fourth doped region having the first conductivity type.

16. An integrated circuit comprising:
a gate electrode over a semiconductor layer;
a channel region under the gate electrode;
a first well in the semiconductor layer and under the gate electrode, the first well having a first conductivity type and a first dopant concentration;
a first source/drain region extending toward the channel region, the first source/drain region having a second conductivity type opposite the first conductivity type;
a second source/drain region extending toward the channel region, the second source/drain region having the second conductivity type; and
a second well having the first conductivity type and a second dopant concentration, the second well comprising a first segment and a second segment respectively spaced apart by a portion of the first well that touches the channel region;
wherein the first segment contains at least a portion of the first source/drain region and the second segment contains at least a portion of the second source/drain region, and wherein the first segment underlaps the gate electrode and the channel region and the second segment forms a PN junction located under a dielectric spacer of the gate electrode;
wherein the dielectric spacer is a first dielectric spacer and further comprising a second dielectric spacer of the gate electrode, and a first extension region having the second conductivity type and extending from the first source/drain region under the first dielectric spacer and wherein the second segment of the second well extends further toward the second source/drain region than does the first extension region.

17. The integrated circuit of claim 16, further comprising a second extension region having the second conductivity type and extending from the second source/drain region under the second dielectric spacer.

18. The integrated circuit of claim 16, wherein the first conductivity type is p-type and the second conductivity type is n-type.

\* \* \* \* \*